(12) United States Patent
Schroeder et al.

(10) Patent No.: US 11,799,279 B2
(45) Date of Patent: Oct. 24, 2023

(54) MULTIFUNCTION SINGLE CORE SENSOR FOR GROUND FAULT APPLICATION

(71) Applicant: Schneider Electric USA, Inc., Andover, MA (US)

(72) Inventors: Jeremy D. Schroeder, Cedar Rapids, IA (US); Juan Ignacio Melecio, Coralville, IA (US)

(73) Assignee: Schneider Electric USA, Inc., Boston, MA (US)

( * ) Notice: Subject to any disclaimer, the term of this patent is extended or adjusted under 35 U.S.C. 154(b) by 110 days.

(21) Appl. No.: 17/375,142

(22) Filed: Jul. 14, 2021

(65) Prior Publication Data

US 2023/0017320 A1  Jan. 19, 2023

(51) Int. Cl.
*H02H 1/00* (2006.01)
*H02H 3/16* (2006.01)
*G01R 31/52* (2020.01)
*H01F 27/28* (2006.01)
*H01F 38/28* (2006.01)

(52) U.S. Cl.
CPC .......... *H02H 1/0007* (2013.01); *G01R 31/52* (2020.01); *H01F 27/28* (2013.01); *H01F 38/28* (2013.01); *H02H 3/16* (2013.01)

(58) Field of Classification Search
CPC ........ H02H 1/0007; H02H 3/16; G01R 31/52; H01F 27/28; H01F 38/28
See application file for complete search history.

(56) References Cited

U.S. PATENT DOCUMENTS

| | | | |
|---|---|---|---|
| 4,280,162 A * | 7/1981 | Tanka | H02H 3/332 |
| | | | 361/45 |
| 4,796,144 A * | 1/1989 | Swift | C08L 51/04 |
| | | | 361/93.6 |
| 6,266,219 B1 | 7/2001 | Macbeth et al. | |
| 6,538,863 B1 | 3/2003 | Macbeth | |
| 6,608,741 B1 | 8/2003 | Macbeth | |
| 6,876,528 B2 | 4/2005 | Macbeth | |
| 7,944,654 B2 * | 5/2011 | Scott | H02H 1/0015 |
| | | | 361/42 |
| 8,421,442 B2 * | 4/2013 | Younsi | G01R 31/52 |
| | | | 324/127 |
| 10,333,290 B2 | 6/2019 | Beierschmitt | |
| 10,890,932 B2 * | 1/2021 | Schaar | G05F 1/20 |
| 2017/0259927 A1 * | 9/2017 | Schram | H02H 3/20 |
| 2019/0097409 A1 * | 3/2019 | Chen | H02H 3/334 |

* cited by examiner

*Primary Examiner* — Akm Zakaria
(74) *Attorney, Agent, or Firm* — Locke Lord LLP

(57) ABSTRACT

A ground fault sensing circuit system includes a current transformer having a first winding and a second winding on opposite halves of the current transformer, outputting first and second signals, each winding coupled to a processor that determines information about respective currents in conductors monitored by the current transformer, based on a combination of the first and second signals. In another embodiment, the current transformer has a third winding wrapped continuously around both halves of the current transformer, overlapped with the first and second windings, the third winding outputting a third signal coupled to the processor, which determines information about respective currents in conductors monitored by the current transformer, based on a combination of the first, second, and third signals.

20 Claims, 10 Drawing Sheets

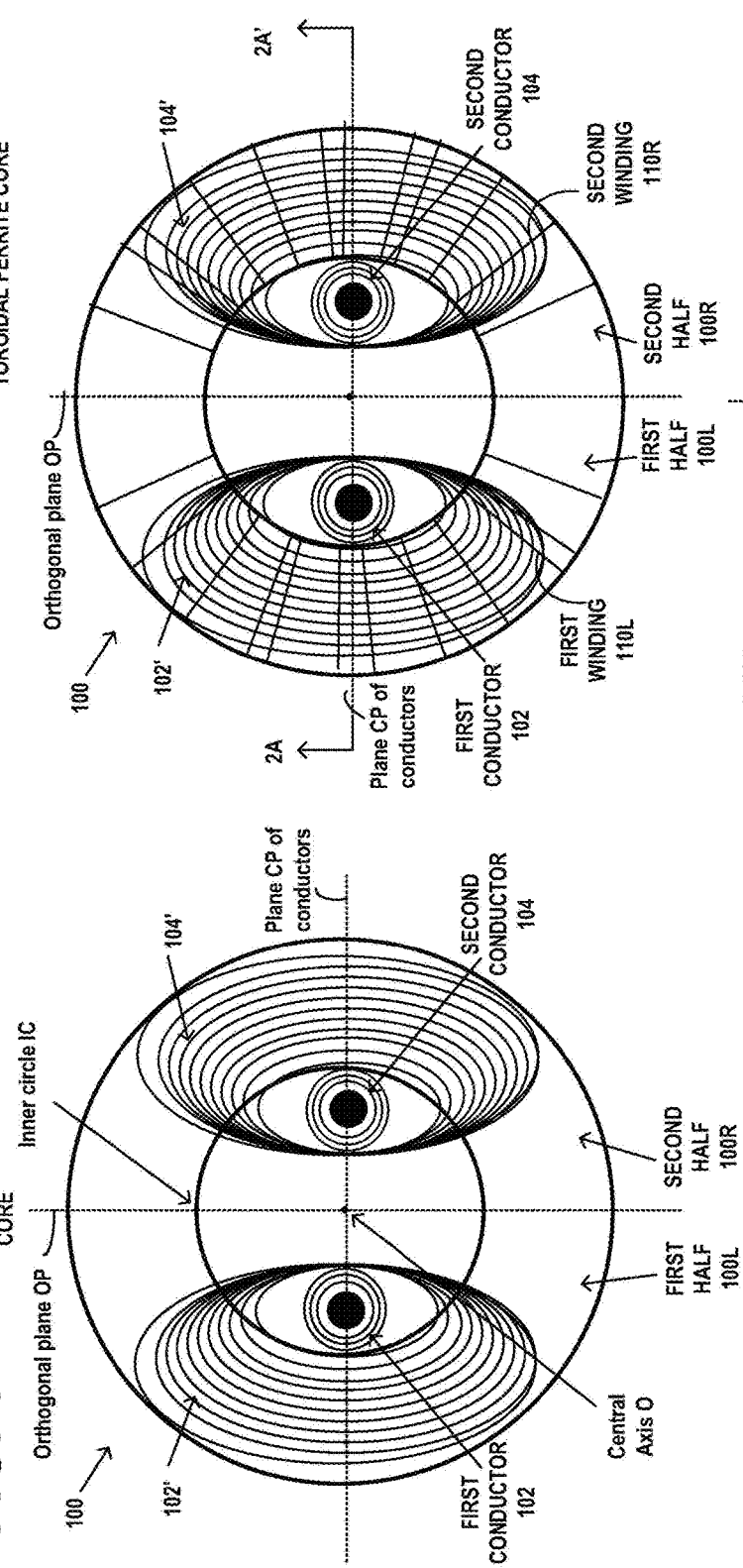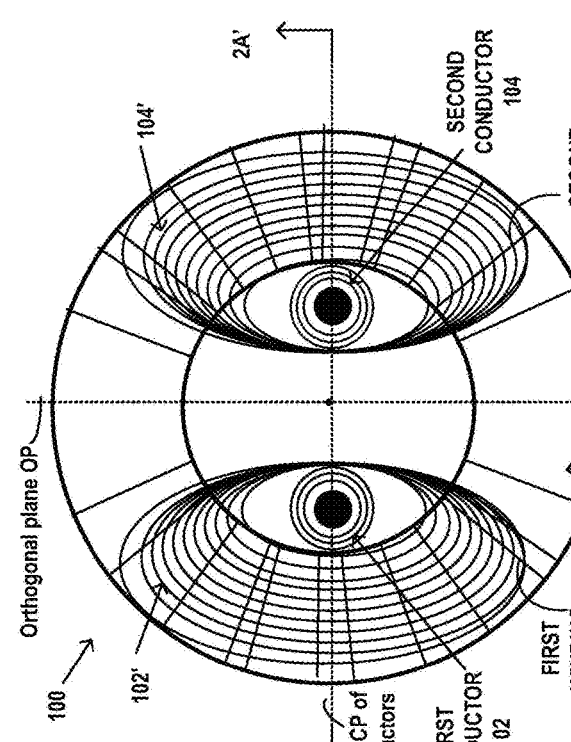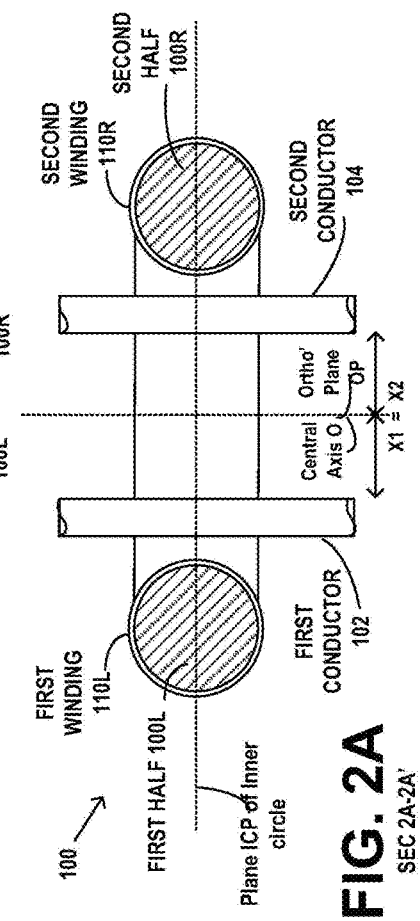

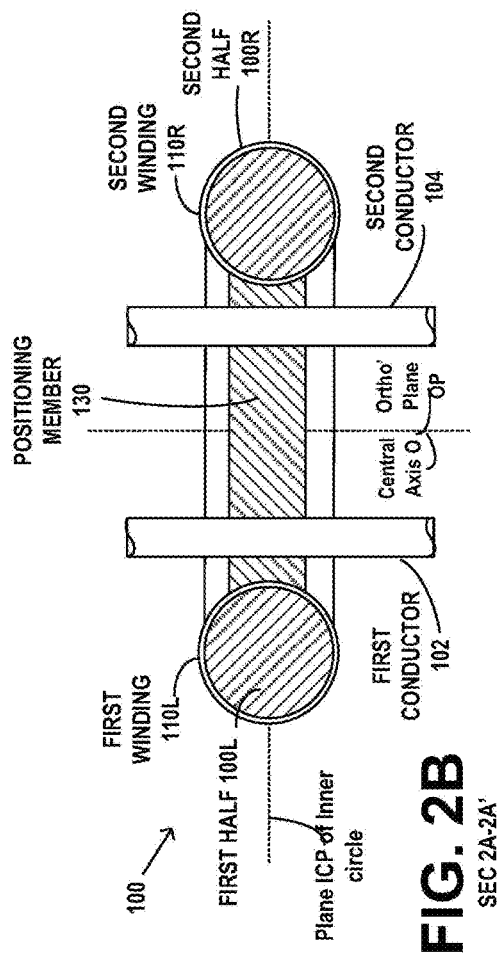
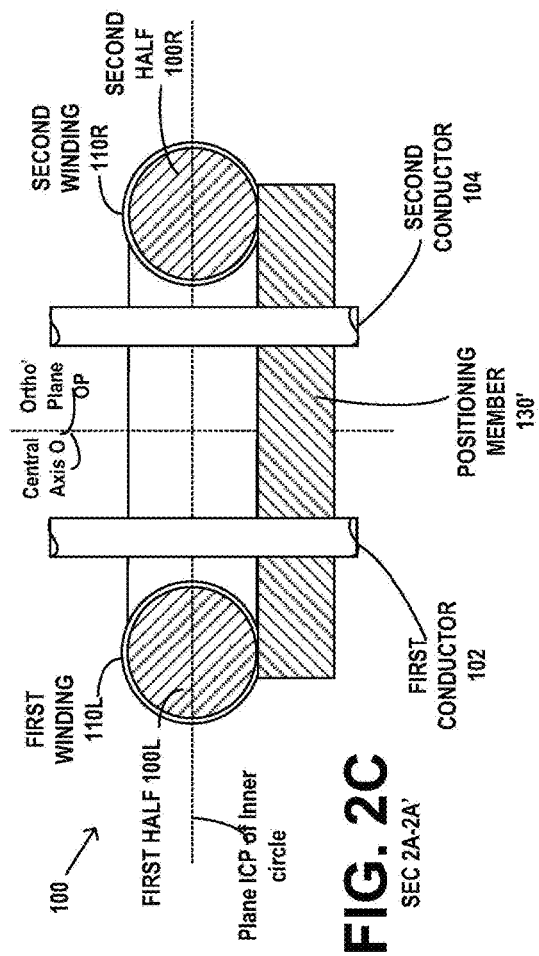

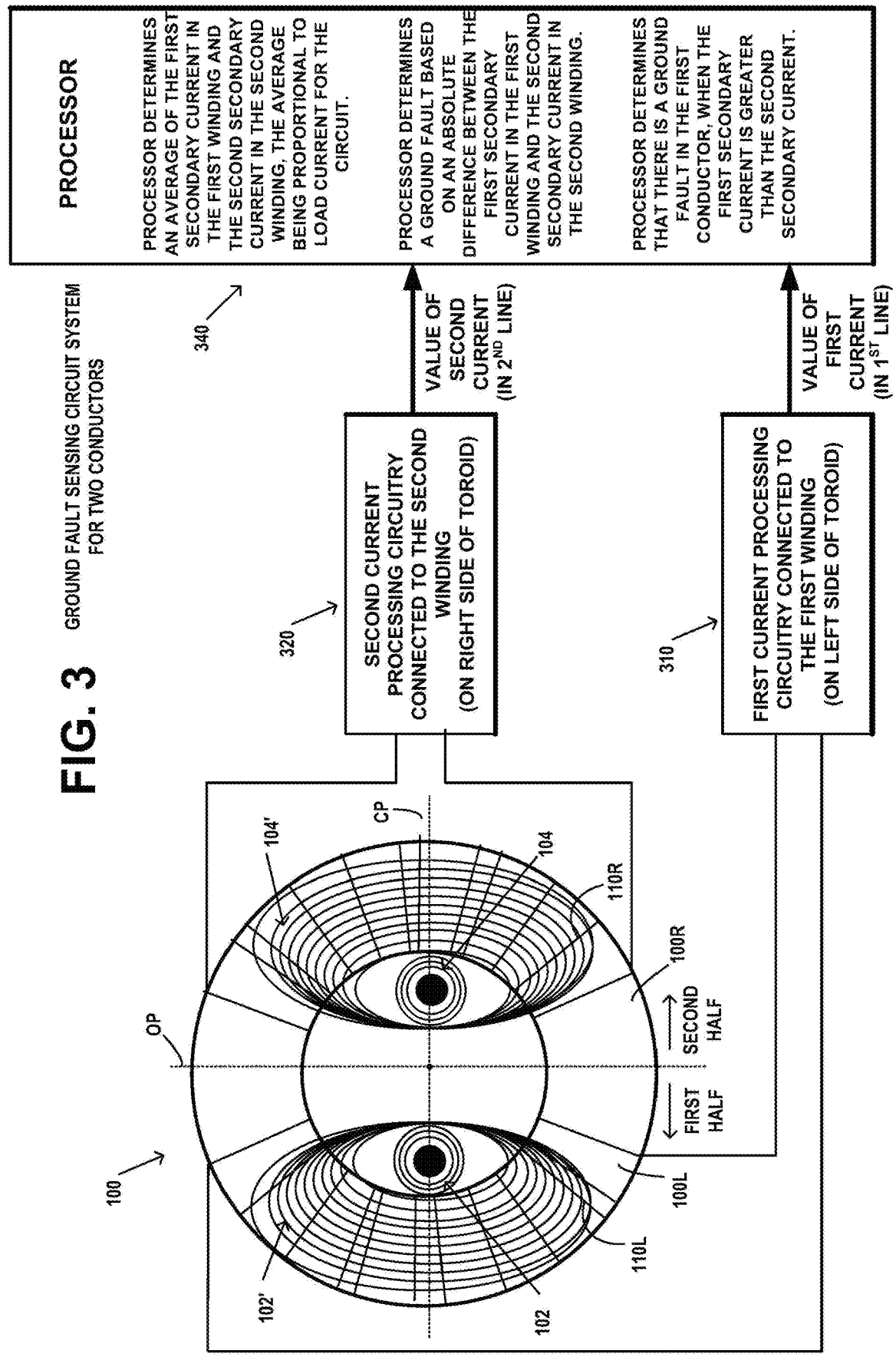
FIG. 3  GROUND FAULT SENSING CIRCUIT SYSTEM FOR TWO CONDUCTORS

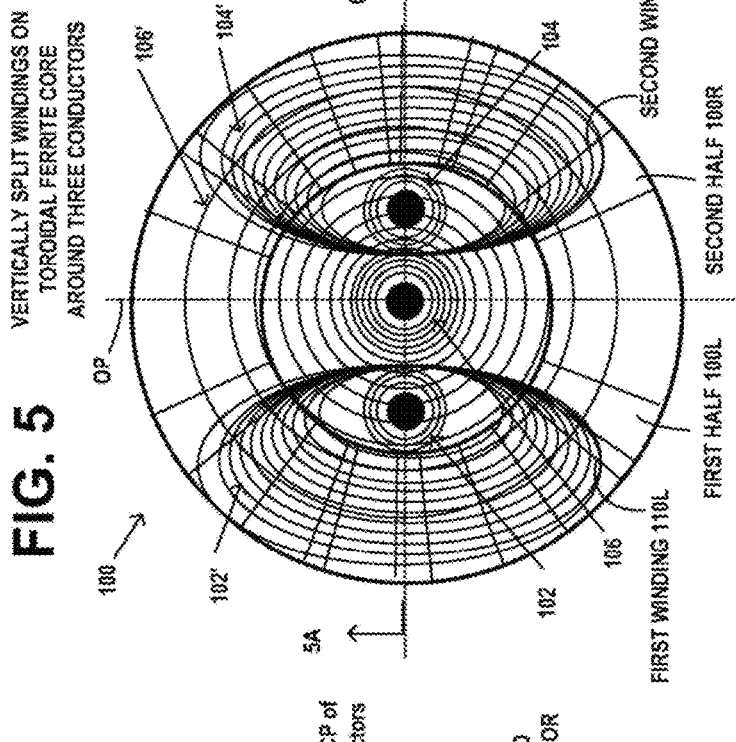
FIG. 5 VERTICALLY SPLIT WINDINGS ON TOROIDAL FERRITE CORE AROUND THREE CONDUCTORS
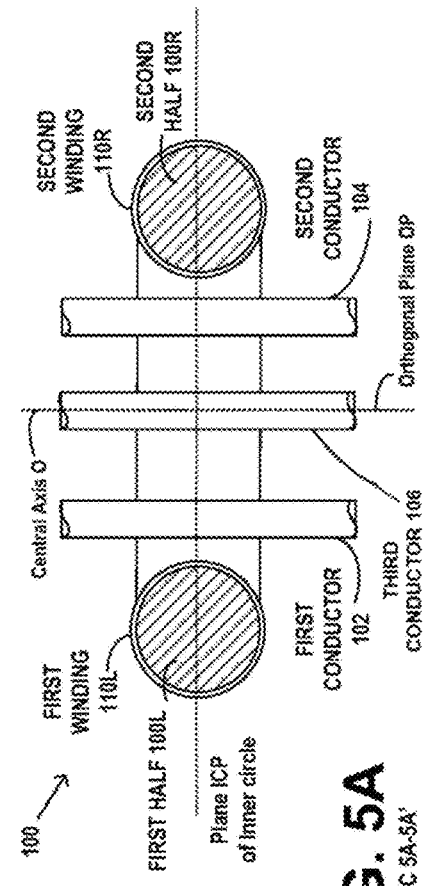
FIG. 5A SEC 5A-5A'
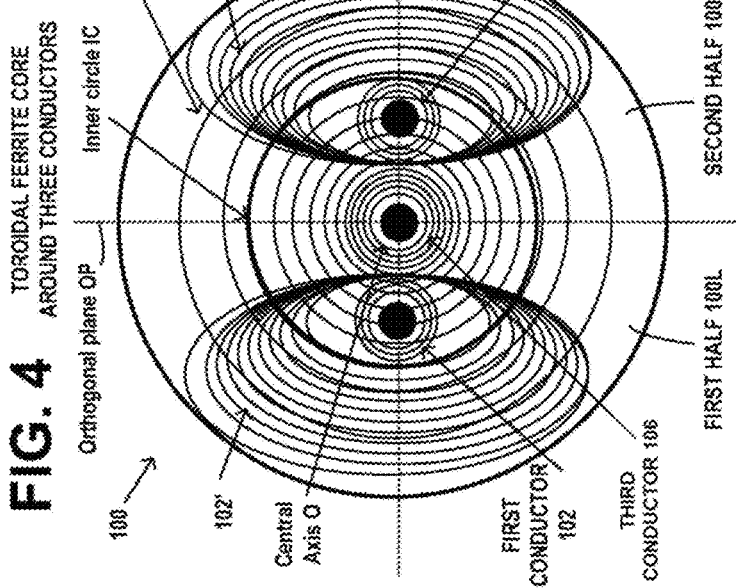
FIG. 4 TOROIDAL FERRITE CORE AROUND THREE CONDUCTORS

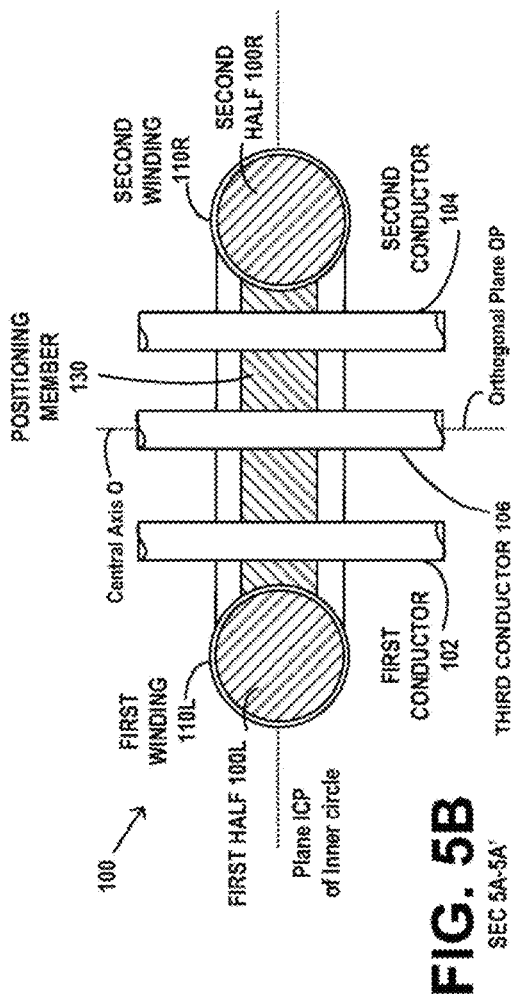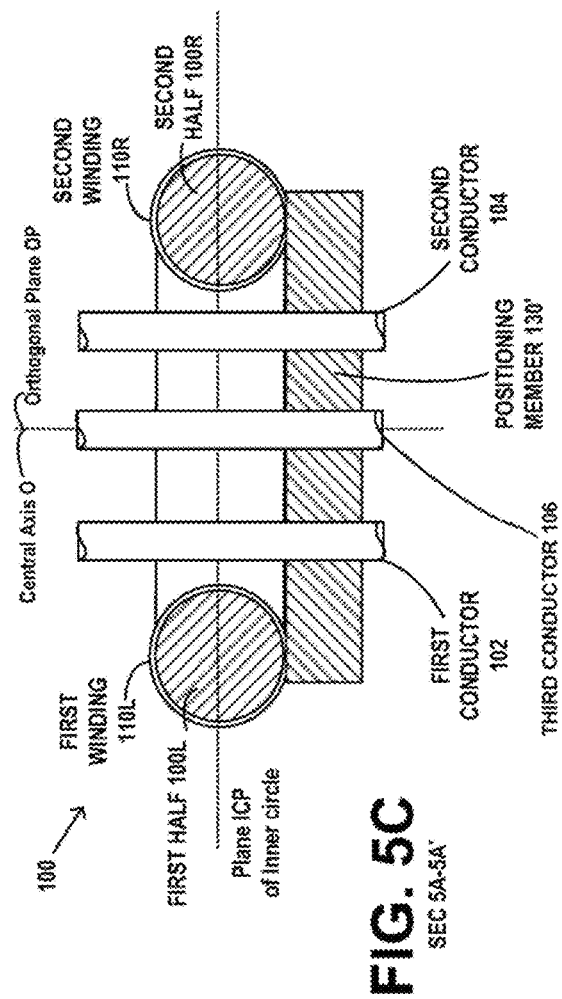

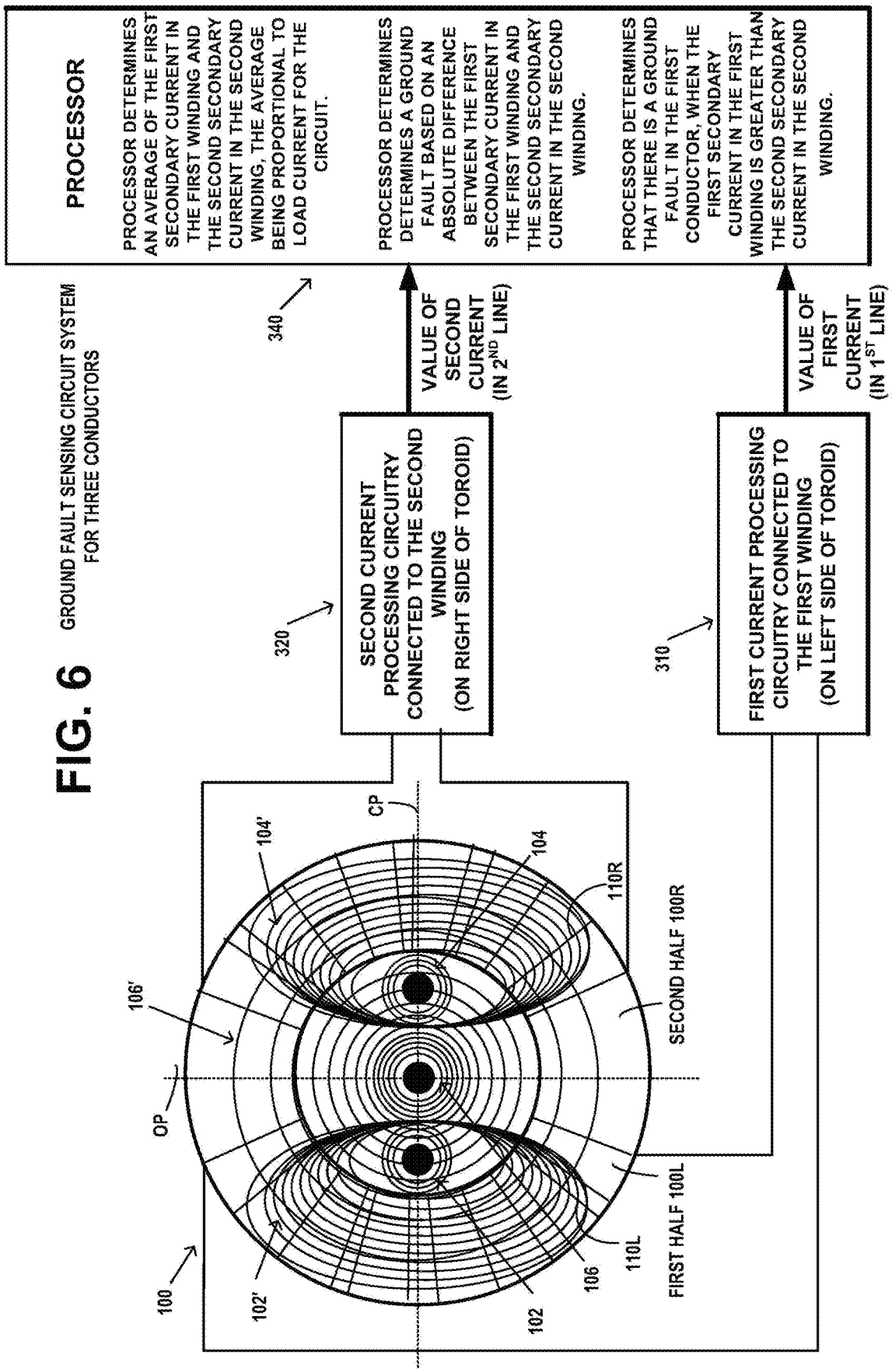

FIG. 6A  EXAMPLE 3 - NO GROUND FAULT

| Load (A) | Output (mV) | | Delta |
|---|---|---|---|
| | 2ND 110R | 1ST 110L | |
| 15 | 0.6576 | 0.6576 | 0.0000 |
| 20 | 0.8768 | 0.8768 | 0.0001 |
| 25 | 1.0960 | 1.0960 | 0.0001 |
| 30 | 1.3152 | 1.3152 | 0.0001 |
| 40 | 1.7535 | 1.7536 | 0.0001 |
| 50 | 2.1921 | 2.1920 | 0.0002 |
| 60 | 2.6305 | 2.6304 | 0.0002 |
| 70 | 3.0690 | 3.0688 | 0.0002 |
| 100 | 4.3843 | 4.3840 | 0.0003 |

FIG. 6B  EXAMPLE 4 - GROUND FAULT L1

| Load (A) | Output (mV) | | Delta |
|---|---|---|---|
| | 2ND 110R | 1ST 110L | |
| 15 | 1.4898 | 1.6268 | 0.1371 |
| 20 | 1.5772 | 1.7481 | 0.1709 |
| 25 | 1.6888 | 1.8871 | 0.1984 |
| 30 | 1.8200 | 2.0403 | 0.2203 |
| 40 | 2.1264 | 2.3778 | 0.2514 |
| 50 | 2.4729 | 2.7440 | 0.2712 |
| 60 | 2.8449 | 3.1289 | 0.2840 |
| 70 | 3.2335 | 3.5262 | 0.2927 |
| 100 | 4.4553 | 4.7617 | 0.3064 |

FIG. 6C  EXAMPLE 5 - THREE PHASE WITH GROUND FAULT L1

| Load | Output (mV) | | Delta |
|---|---|---|---|
| | 2ND 110R | 1ST 110L | |
| 15.005<0 15<120 15<240 | 1.4183 | 2.1359 | 0.7176 |
| 20.005<0 20<120 20<240 | 1.6118 | 2.4477 | 0.8359 |
| 25.005<0 25<120 25<240 | 1.8638 | 2.7762 | 0.9124 |
| 30.005<0 30<120 30<240 | 2.1540 | 3.1161 | 0.9621 |
| 40.005<0 40<120 40<240 | 2.8002 | 3.8179 | 1.0177 |
| 50.005<0 50<120 50<240 | 3.4930 | 4.5377 | 1.0446 |
| 60.005<0 60<120 60<240 | 4.2096 | 5.2679 | 1.0583 |
| 70.005<0 70<120 70<241 | 4.9396 | 6.0050 | 1.0653 |
| 100.005<0 100<120 100<242 | 7.1688 | 8.2382 | 1.0693 |

VERTICALLY SPLIT WINDINGS AND CONTINUOUS WINDING (BOTH SIDES) ON TOROIDAL FERRITE CORE FOR THREE CONDUCTORS

SEC 7A-7A'

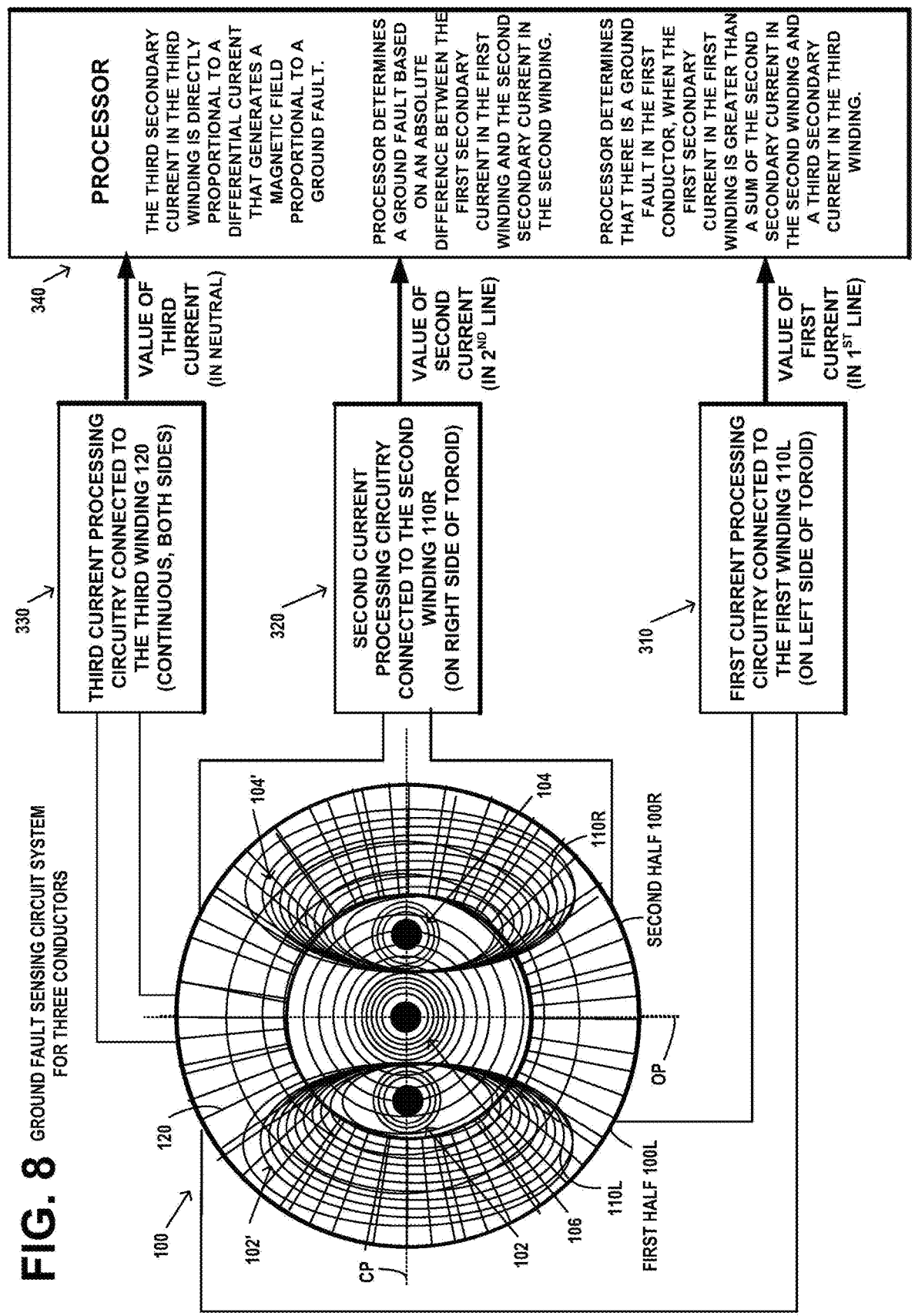

FIG. 8A  EXAMPLE 7 - GROUND FAULT L1

| Load (A) | Output (mV) | | |
|---|---|---|---|
| | 1st 110L | 2nd 110R | 3rd 120 |
| 15 | 1.8006 | 1.6462 | 1.1947 |
| 20 | 2.1627 | 1.9915 | 1.1946 |
| 25 | 2.5488 | 2.3677 | 1.1945 |
| 30 | 2.9497 | 2.7624 | 1.1945 |
| 40 | 3.7766 | 3.5822 | 1.1943 |
| 50 | 4.6220 | 4.4239 | 1.1942 |
| 60 | 5.4773 | 5.2770 | 1.1940 |
| 70 | 6.3386 | 6.1367 | 1.1939 |
| 100 | 8.9410 | 8.7362 | 1.1935 |

MULTIFUNCTION SINGLE CORE SENSOR FOR GROUND FAULT APPLICATION

TECHNICAL FIELD

The present disclosure is directed generally to circuit breakers, and, more particularly, to current transformers in miniature circuit breakers.

BACKGROUND

Typically, miniature circuit breakers are used to protect branch circuits in homes and in commercial and light industry applications. For example, the miniature circuit breakers utilize an arc fault detector, a ground fault detector, a magnetic armature that is responsive to large magnetic forces generated by a short-circuit current, and/or a thermo-magnetic trip device that incorporates a bimetal responsive to persistent overload conditions.

The typical ground fault circuit interrupter (GFCI) circuit breaker includes a current transformer having both power lines serving as its primary and having its secondary coil connected to an input of a ground fault detector in the electronics module. The ground-fault current transformer senses when the currents in the two power lines are not the same magnitude, and outputs a signal to the ground fault detector. The ground fault detector outputs signals to the microcontroller when a ground fault is detected for the two power lines. The microcontroller then sends a trip signal to the solenoid to cause the latching mechanism to separate the main contacts to interrupt the current in the branch circuit.

A problem in the manufacture of conventional miniature circuit breakers is an unacceptably wide tolerance in the magnetic properties of current transformers, either those manufactured or procured from vendors, as a component in the assembly of miniature circuit breakers. The use of a current transformer whose magnetic properties are out of specification, may result in a circuit breaker that does not detect an arc fault or a ground fault. Expensive component testing and screening of current transformers is required during the manufacture of circuit breakers, to reject those current transformers having errors that are inherent in the windings around the core of a current transformer.

What is needed, therefore, a way to reduce the effects in a miniature circuit breaker, of errors that are inherent in the windings around the core of a current transformer.

In addition, a significant advantage could accrue for miniature circuit breakers, by providing a current transformer with the dual functions of both measuring the load current as well as detecting a ground fault.

SUMMARY

A ground fault sensing circuit system includes a current transformer having a first winding and a second winding on opposite halves of the current transformer, outputting first and second signals, each winding coupled to a processor that determines information about respective currents in conductors monitored by the current transformer, based on a combination of the first and second signals. In another embodiment, the current transformer has a third winding wrapped continuously around both halves of the current transformer, overlapped with the first and second windings, the third winding outputting a third signal coupled to the processor, which determines information about respective currents in conductors monitored by the current transformer, based on a combination of the first, second, and third signals.

A ground fault sensor of the ground fault sensing circuit system includes a toroidal current transformer having first and second windings wrapped around the toroid and through its opening. A first winding on a first half of the toroid and a second winding on a second half of the toroid are symmetrically opposed about an orthogonal plane perpendicular to a conductor plane. The conductor plane contains two parallel circuit conductors positioned equidistantly from a central axis of the toroid. The first circuit conductor is positioned near the first winding and the second circuit conductor is positioned near the second winding. A first secondary current in the first winding is based on magnetic flux in the first winding magnetically coupled from current in the first conductor and a second secondary current in the second winding is based on magnetic flux in the second winding magnetically coupled from current in the second conductor.

In component testing and screening of single winding sensors during manufacture, the measured secondary current may have a winding distribution error that deviates from a target mean value. The winding distribution errors may be carried over to errors in detecting a ground fault when applied in a circuit breaker. Component testing and screening of the ground fault dual winding sensor may be performed during manufacture, by determining an average of the first secondary current in the first winding and the second secondary current in the second winding. The average of the first and second secondary currents will be closer to a target mean value of the winding distribution errors than are the individual first and second secondary currents. Determining the average of the two secondary currents minimizes errors that are inherent in the windings around the core of a current transformer.

As used in a miniature circuit breaker, the ground fault dual winding sensor may perform dual functions of both measuring the load current as well as detecting a ground fault. The load current may be measured using either or both the first and second secondary currents. A ground fault may be determined based on a difference between the first and second secondary currents.

Moreover, the ground fault dual winding sensor is able to distinguish which circuit conductor has the ground fault, a function not provided by pairs of conventional current transformers. A ground fault in the first conductor is determined when the first secondary current is greater than the second secondary current. A ground fault in the second conductor is determined when the second secondary current is greater than the first secondary current.

In accordance with one example embodiment described herein, a ground fault sensor for a circuit consisting of a plurality of conductors, comprises:

a current transformer having a body with an opening having a central axis running along a length of the opening, the current transformer having a first winding and a second winding wrapped around the body and through the opening, the first winding configured to output a first signal and the second winding configured to output a second signal, the body surrounding two parallel conductors that pass through the opening parallel with the central axis and occupy a conductor plane that is coincident with the central axis, the two parallel conductors being substantially equidistant from the central axis;

wherein the first winding is wrapped around a first half of the body and the second winding is non-overlapped, is wrapped around a second half of the body.

In accordance with one example embodiment described herein, a ground fault sensor further comprises: wherein information about a combination of the first signal in the first winding and the second signal in the second winding is determined by a combined signal circuit.

In accordance with one example embodiment described herein, a ground fault sensor further comprises: wherein the body surrounds a third conductor that passes through the opening of the body and is coincident with the central axis;

In accordance with one example embodiment described herein, a ground fault sensor further comprises: wherein a third winding is wrapped continuously around both halves of the body, through the opening, overlapped with the first and second windings and configured to output a third signal; and wherein the first winding is configured to output the first signal on a first signal chain, the second winding is configured to output the second signal on a second signal chain, the third winding is configured to output the third signal on a third signal chain, and the first signal chain, second signal chain, and third signal chain are connected to a combined signal circuit.

In accordance with one example embodiment described herein, wherein the first half of the body and the second half of the body are symmetrically opposed about an orthogonal plane that is substantially perpendicular to the conductor plane;

wherein a first conductor of the two parallel conductors is closer to the first winding than to the second winding, and a second conductor of the two parallel conductors is positioned closer to the second winding than to the first winding; and wherein the first signal in the first winding is a first secondary current induced therein based on magnetic flux in the first winding magnetically coupled from a first current in the first conductor and the second signal in the second winding is a second secondary current induced therein based on magnetic flux in the second winding magnetically coupled from a second current in the second conductor, the second secondary current being independent of the first secondary current.

In accordance with one example embodiment described herein, a ground fault sensor, wherein the first winding is configured to output the first signal on a first signal chain, the second winding is configured to output the second signal on a second signal chain, the first signal chain and second signal chain are connected to a combined signal circuit, and wherein the combined signal circuit is an averaging circuit that determines an average of the first and second signals.

In accordance with one example embodiment described herein, a ground fault sensor, wherein the first signal is output on a first signal chain, wherein the second signal is output on a second signal chain, and wherein the first signal chain and the second signal chain are independent with respect to one another.

In accordance with one example embodiment described herein, a ground fault sensing circuit system, comprises:

a current transformer having a body with an opening having a central axis running along a length of the opening, the current transformer having a first winding and a second winding wrapped around the body and through the opening, the first winding configured to output a first signal and the second winding configured to output a second signal, the body surrounding two parallel conductors that pass through the opening parallel with the central axis and occupy a conductor plane that is coincident with the central axis, the two parallel conductors being substantially equidistant from the central axis;

wherein the first winding is wrapped around a first half of the body and the second winding is non-overlapped, is wrapped around a second half of the body; and a processor coupled to the first winding to receive the first signal and coupled to the second winding to receive the second signal, the processor configured to determine information about at least one of a first current in a first conductor or a second current in a second conductor of the two parallel conductors, based on a combination of the first signal and the second signal.

In accordance with one example embodiment described herein, a ground fault sensing circuit system, comprises:

a current transformer having a body with an opening having a central axis running along a length of the opening, the current transformer having a first winding and a second winding wrapped around the body and through the opening, the first winding configured to output a first signal and the second winding configured to output a second signal the body surrounding two parallel conductors that pass through the opening parallel with the central axis and occupy a conductor plane that is coincident with the central axis, the two parallel conductors being substantially equidistant from the central axis;

wherein the body surrounds a third conductor that passes through the opening of the body and is coincident with the central axis;

wherein the first winding is wrapped around a first half of the body and the second winding is non-overlapped and wrapped around a second half of the body;

wherein a third winding is wrapped continuously around both halves of the body, through the opening, overlapped with the first and second windings, and configured to output a third signal; and a processor coupled to the first winding to receive the first signal, coupled to the second winding to receive the second signal, and coupled to the third winding to receive the third signal, the processor configured to determine information about at least one of a first current in a first conductor or a second current in a second conductor of the two parallel conductors, or a third current in the third conductor, based on a combination of the first signal in the first winding, the second signal in the second winding, and the third signal in the third winding.

The resulting apparatus and system provide a multifunction single core sensor for ground fault application, which reduce the effects in a miniature circuit breaker, of errors that are inherent in the windings around the core of a current transformer. Moreover, the multifunction single core sensor reduces the need for extra current transformers in a miniature circuit breaker, by performing dual functions of both measuring the load current as well as detecting a ground fault.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIG. 1 is a front view of a toroidal ferrite core surrounding two current carrying conductors that pass through on the left and right sides of the central opening of the toroid, illustrating lines of magnetic flux in the left half of the core produced by the current in the left conductor and lines of magnetic flux in the right half of the core produced by the current in the right conductor, according to an embodiment of the disclosure.

FIG. 2 is a front view of a two conductor double-winding current transformer formed from the toroidal ferrite core of FIG. 1, further including a left side, first winding on the left half of the toroid coupling the lines of magnetic flux in the left half of the core, and a right side, second winding on the right half of the toroid coupling the lines of magnetic flux in the right half of the core, according to an embodiment of the disclosure.

FIG. 2A is a cross sectional view along the section line 2A-2A' of the two conductor current transformer of FIG. 2, showing the first and second windings and the first conductor and the second conductor, according to an embodiment of the disclosure.

FIG. 2B is a cross sectional view along the section line 2A-2A' of the two conductor current transformer of FIG. 2, showing an optional positioning member affixed to the toroidal body, configured to position the first and second conductors in the conductor plane, according to an embodiment of the disclosure.

FIG. 2C is a cross sectional view along the section line 2A-2A' of the two conductor current transformer of FIG. 2, showing a second optional positioning member affixed to the toroidal body, configured to position the first and second conductors in the conductor plane, according to an embodiment of the disclosure.

FIG. 3 illustrates a double-winding ground fault sensing circuit system for two conductors, using the two conductor current transformer of FIG. 2, with a first current processing circuitry connected to the first winding, a second current processing circuitry connected to the second winding, and a processor or output circuit connected to the first and second processing circuitry, configured to determine a ground fault in one of the first conductor or the second conductor, according to an embodiment of the disclosure.

FIG. 4 is a front view of a toroidal ferrite core surrounding three conductors that pass through the central opening of the toroid of FIG. 1, the third conductor passing through the opening coincident with the central axis of the toroid, according to an embodiment of the disclosure.

FIG. 5 is a front view of a three conductor double-winding current transformer formed from the toroidal ferrite core of FIG. 4, according to an embodiment of the disclosure.

FIG. 5A is a cross sectional view along the section line 5A-5A' of the three conductor current transformer of FIG. 5, showing the first and second windings and the first conductor, the second conductor, and the third conductor, according to an embodiment of the disclosure.

FIG. 5B is a cross sectional view along the section line 5A-5A' of the three conductor current transformer of FIG. 5, showing an example optional member affixed to the toroidal body, configured to position the first, second, and third conductors in the conductor plane, according to an embodiment of the disclosure.

FIG. 5C is a cross sectional view along the section line 5A-5A' of the three conductor current transformer of FIG. 5, showing a second example optional member affixed to the toroidal body, configured to position the first, second, and third conductors in the conductor plane, according to an embodiment of the disclosure.

FIG. 6 illustrates a double-winding ground fault sensing circuit system for three conductors, using the three conductor current transformer of FIG. 5, with a first current processing circuitry connected to the first winding, a second current processing circuitry connected to the second winding, and a processor or output circuit connected to the first and second processing circuitry, configured to determine a ground fault in one of the first conductor or the second conductor, according to an embodiment of the disclosure.

FIG. 6A is an example table of representative data for Example 3, illustrating a double-winding, three conductor, no ground fault test with the processor determining that the difference delta between the first secondary current in the first winding 110L substantially equals the second secondary current in the second winding 110R.

FIG. 6B is an example table of representative data for Example 4, illustrating a double-winding, three conductor, and ground fault in conductor L1, with the processor determining that the first secondary current in the first winding 110L is substantially greater than the second secondary current in the second winding 110R.

FIG. 6C is an example table of representative data for Example 5, illustrating a double-winding, three phase, three conductor, and ground fault in conductor L1, with the processor determining that the first secondary current in the first winding 110L is substantially greater than the second secondary current in the second winding 110R.

FIG. 8 illustrates a triple-winding ground fault sensing circuit system for three conductors, using the three conductor current transformer of FIG. 7, with a first current processing circuitry connected to the first winding, a second current processing circuitry connected to the second winding, a third current processing circuitry connected to the third winding, and a processor connected to the first, second, and third processing circuitry, configured to determine a ground fault in one of the first conductor or the second conductor, according to an embodiment of the disclosure.

FIG. 8A is an example table of representative data for Example 7, illustrating a triple-winding, single-phase, three conductor, and ground fault in conductor L1, with the processor determining that the first secondary current in the first winding 110L is substantially greater than the second secondary current in the second winding 110R.

DETAILED DESCRIPTION

Figure 7:
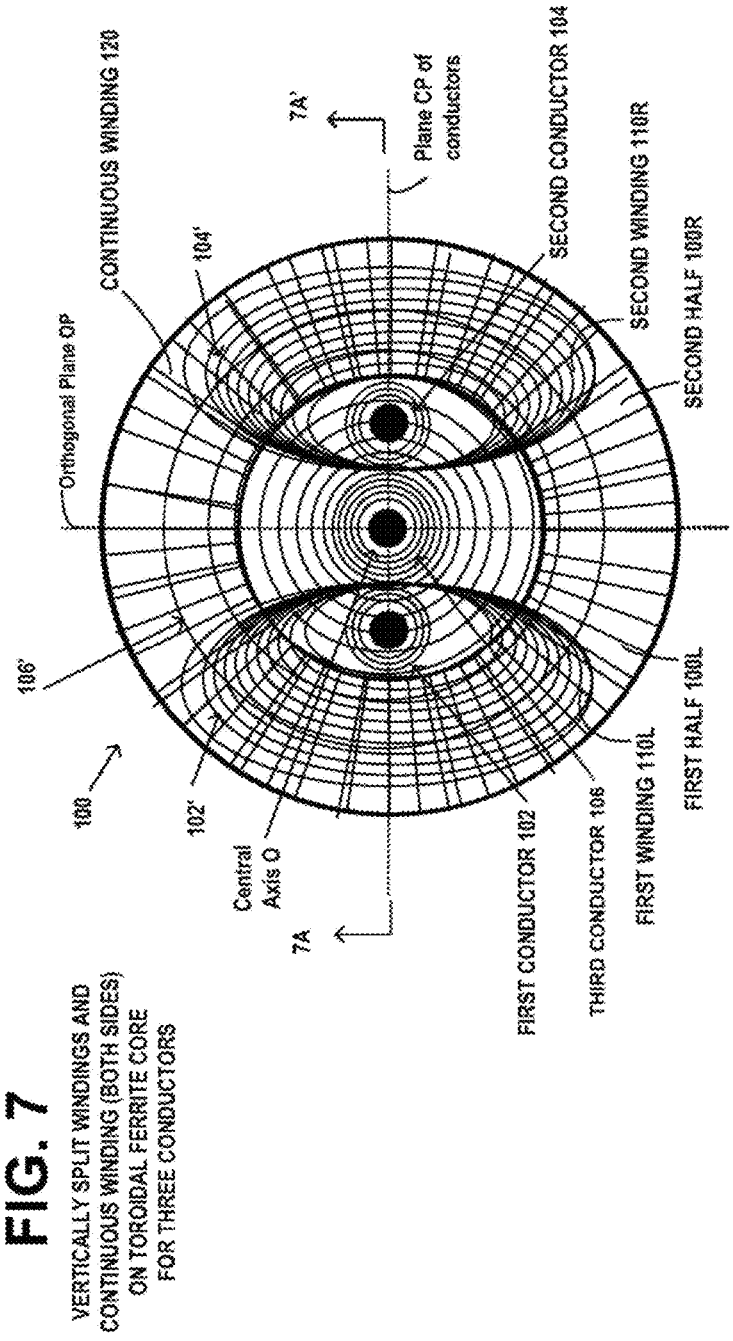
FIG. 7 is a front view of a three conductor triple-winding current transformer with a third continuous winding formed from the toroidal ferrite core of FIG. 5, according to an embodiment of the disclosure.

A current carrying conductor in air or free space, generates a magnetic flux in a circular path surrounding the conductor, having a magnetic flux density that varies as 1/r with a radial distance r from the conductor. When a portion of the magnetic field passes through a nearby ferromagnetic material that has a relatively large magnetic permeability, the circular shape of the magnetic flux around the conductor becomes distorted toward the ferromagnetic material, the magnitude of the magnetic flux density passing through the material is multiplied by the value of the relatively large permeability and becomes concentrated in the region of the ferromagnetic material through which it passes.

FIG. 1 is an example of a toroidal ferrite core 100 surrounding two current carrying conductors 102 and 104 that pass through the central opening of the toroid. The first conductor 102 is positioned on the left side of the opening and the second conductor 104 is positioned substantially equidistant on the right side of the opening with respect to a central axis "O" of the toroid. The central, circular opening of the toroid defines an inner circle occupying a plane ICP (FIG. 2A) that has the central axis "O" perpendicular to the plane of the inner circle ICP. The central axis "O" runs along the length of the opening.

FIG. 2 shows a ground fault double-winding sensor comprising the toroidal ferrite core 100 of FIG. 1, having a first winding 110L and a second winding 110R that is not connected to the first winding 110L. Each of the first and second windings is wrapped around the body and through the opening of the toroid. The first winding 102 is configured to output a first signal and the second winding 104 configured to output a second signal.

The two parallel conductors 102 and 104 pass through the opening parallel with the central axis "O" and occupy a conductor plane CP that is coincident with the central axis "O". The first conductor 102 is at a distance X1 from the central axis "O" and second conductor 104 is at a distance X2 from the central axis "O", with X1=X2, as shown in FIG. 2A.

The first winding 110L is wrapped around a first half circumference 100L of the toroidal body 100 and the second winding 110R is non-overlapped and wrapped around a second half circumference 100R of the toroidal body 100. The first half circumference 100L of the toroidal body 100 and the second half circumference 100R of the toroidal body 100 are symmetrically opposed about an orthogonal plane OP that is perpendicular to the conductor plane CP.

The first conductor 102 is positioned near to the first winding 110L on the first half circumference 100L of the toroidal shape 100. A first secondary current in the first winding 110L is induced by magnetic flux 102' in the first winding 110L that is magnetically coupled with the first current in the first conductor 102.

The second conductor 104 is positioned near to the second winding 110R on the second half circumference 100R of the toroidal shape 100. A second secondary current in the second winding 110R is induced by magnetic flux 104' in the second winding 110R that is magnetically coupled with the second current in the second conductor 104.

FIG. 2A is a cross sectional view along the section line 2A-2A' of the two conductor current transformer of FIG. 2, showing the first winding 110L, the second winding 110R, the first conductor 102, and the second conductor 104, according to an embodiment of the disclosure.

FIG. 2B is a cross sectional view along the section line 2A-2A' of the two conductor current transformer of FIG. 2, showing an optional positioning member 130 affixed to the toroidal body 100, configured to position the first 102 and second 104 conductors in the conductor plane CP (FIG. 2), according to an embodiment of the disclosure. The optional positioning member may be a casting or injection molded electrically insulating material, such as an epoxy resin, with a low magnetic permeability, which is bonded to or otherwise affixed to the inner circular surface of the toroidal body 100.

FIG. 2C is a cross sectional view along the section line 2A-2A' of the two conductor current transformer of FIG. 2, showing another optional example positioning member 130' affixed to the toroidal body 100, configured to position the first 102 and second 104 conductors in the conductor plane CP (FIG. 2), according to an embodiment of the disclosure. The optional positioning member may be a plate or cover of electrically insulating material, such as polystyrene or polypropylene plastic, with a low magnetic permeability, which is bonded to or otherwise affixed to the side surface of the toroidal body 100.

FIG. 3 illustrates the ground fault double-winding sensor of FIG. 2 in an example double-winding ground fault sensing circuit system that further includes a first current processing circuitry 310 connected to the first winding 110L, which is configured to determine the first secondary current in the first winding 110L. A second current processing circuitry 320 is connected to the second winding 110R, which is configured to determine the second secondary current in the second winding 110R. The first winding 110L is configured to output the first secondary current or signal and the second winding 110R that is not connected to the first winding 110L, is configured to output the second secondary current or signal that is independent of the first secondary current or signal. A processor 340 or output circuit, which may be a digital or analog processor, is connected to the first current processing circuitry 310 and the second current processing circuitry 320. An example of the first current processing circuitry 310 may be to apply the first secondary current to a burden resistor to generate a voltage signal that is input to the processor 340. The second secondary current is processed by the second current processing circuit 320 that has similar components to output a separate input to the processor 340. Information about a combination of the first secondary current or signal in the first winding 110L and the second secondary current or signal in the second winding 110R is determined by the processor 340 or output circuit.

Example 1: Double-Winding, Two Conductor, No Ground Fault

In a first example of the double-winding ground fault sensing circuit system of FIG. 3 on the load side of the circuit breaker, let the first conductor 102 be the L1 load conductor 102 and the second conductor 104 be a neutral conductor N 104 in a single phase, two wire power system. If there is no ground fault condition in the L1 load conductor 102 and there is no ground fault condition in the N neutral conductor 104, then the current in the N neutral conductor 106 will equal the current in the L1 load conductor. The magnitude of the magnetic fluxes 102' and 104' that couple the first winding 110L will equal the magnitude of the magnetic fluxes 102' and 104' that couple the second winding 110R. Accordingly, the processor 340 determines that the first secondary current in the first winding 110L will equal the second secondary current in the second winding 110R. The secondary current in either of the windings 110L and 110R may be used by the processor 340 to determine the load current in the L1 load conductor 102 or the load current in the N neutral conductor 104.

Example 2: Double-Winding, Two Conductor, Ground Fault in L1

In a second example of the double-winding ground fault sensing circuit system of FIG. 3 on the load side of the circuit breaker, let the first conductor 102 be the L1 load conductor 102 and the second conductor 104 be the N neutral conductor 104 in the single phase, two wire power system. Let there be a 5 mA ground fault condition in the L1 load conductor 102 and no ground fault condition in the N neutral conductor 104. The total current due to the fault condition in the L1 load conductor 102 will be the L1 line current from the power source plus the 5 mA ground fault current. The current in the neutral N conductor 104 will be the current in the L1 load conductor 102 minus the 5 mA ground fault current. The magnitude of the magnetic fluxes 102' and 104' that couple the first winding 110L due to the current in the L1 load conductor 102 will be larger than the magnitude of the magnetic fluxes 102' and 104' that couple the second winding 110R due to the current in the N neutral conductor 104. Accordingly, the processor 340 determines that the first secondary current in the first winding 110L will be larger than the second secondary current in the second winding 110R. The difference between first secondary current in the first winding 110L and the second secondary current in the second winding 110R, will be directly proportional to the fault current. Depending on which winding, either 110L or 110R, has the higher output, this will indicate whether the L1 load conductor 102 or the N neutral conductor 104 has the fault condition.

In component testing and screening of single winding sensors during manufacture, the measured secondary current may have a winding distribution error, which may be carried over to errors in detecting a ground fault when applied in a circuit breaker. In component testing and screening of the ground fault dual winding sensor of FIG. 2 during manufacture, an average may be determined by the processor 340 of the first secondary current in the first winding 110L and the second secondary current in the second winding 110R. The average value of the secondary currents is related or proportional to load current for the circuit comprising conductors 102 and 104. Determining the average of the two secondary currents minimizes errors that are inherent in the windings around the core of a current transformer. In the ground fault sensor, errors in measurement of the first secondary current and the second secondary current are minimized, the errors being inherent in the windings around the toroidal body of the current transformer.

As used in a miniature circuit breaker, the ground fault sensing circuit of FIG. 3 is a multifunction single core sensor for ground fault application, which has the capability to perform the functions of two conventional current transformers. A first function is its ability to sense both load current on a single conductor, either 102 or 104, and ground faults between the two conductors 102 and 104. Secondly, a ground fault may be determined based on an absolute difference between the first and second secondary currents.

Moreover, the ground fault sensing circuit of FIG. 3 is able to distinguish which circuit conductor 102 or 104 has the ground fault. This is a function that is not provided by conventional current transformers. A ground fault in the first conductor 102 is determined when the first secondary current in the first winding 110L is greater than the second secondary current in the second winding 110R. And oppositely, a ground fault in the second conductor 104 is determined when the second secondary current in the second winding 110R is greater than the first secondary current in the first winding 110L.

In example embodiments, the first conductor 102 may be a line conductor and the second conductor 104 may be a neutral conductor in a single phase, two wire power system.

The benefits of the double-winding ground fault sensing circuit system of FIG. 3, include:

Determine if a ground fault is the left pole or the right pole;
Measure load current:
Run time adjustment to thresholds to account for load shift.
Report load current to end user.
Electronically track thermal overloads.

FIG. 4 is a front view of the toroidal ferrite core 100 surrounding three conductors 102, 104 and 106 that pass through the central opening of the toroid 100. The first conductor 102 is on the left side of the opening, the second conductor 104 is on the right side of the opening, and the third conductor 106 that passes through the opening and is coincident with the central axis "O".

FIG. 4 illustrates the lines of magnetic flux 102' in the left half 100L of the core produced by an electrical current in the first conductor 102, the lines of magnetic flux 104' in the right half 100R of the core produced by an electrical current in the second conductor 104, and the lines of magnetic flux 106' around the entire circumference of the toroid 100 produced by an electrical current in the third conductor 106, according to an embodiment of the disclosure.

FIG. 5 is a front view of a three conductor current transformer formed from the toroidal ferrite core 100 of FIG. 4. The figure includes the left side, first winding 110L on the left half 100L of the toroid 100 wrapped around the opening of the toroid and coupling the lines of magnetic flux 102' in the left half 110L of the core produced by a first current in the first conductor 102. The right side, second winding 110R on the right half 100R of the toroid 100 wrapped around the opening of the toroid and coupling the lines of magnetic flux 104' in the right half 100R of the core produced by second current in the second conductor 104. The lines of magnetic flux 106' around the entire circumference of the toroid 100 are produced by an electrical current in the third conductor 106, according to an embodiment of the disclosure.

FIG. 5A is a cross sectional view along the section line 5A-5A' of the three conductor current transformer of FIG. 5, showing the first 110L and second 110R windings and the first conductor 102, the second conductor 104, and the third conductor 106, according to an embodiment of the disclosure.

FIG. 5B is a cross sectional view along the section line 5A-5A' of the three conductor current transformer of FIG. 5, showing an optional positioning member 130 affixed to the toroidal body 100, configured to position the first 102, second 104, and third 106 conductors in the conductor plane CP (FIG. 5), according to an embodiment of the disclosure. The optional positioning member may be a casting or injection molded electrically insulating material, such as an epoxy resin, with a low magnetic permeability, which is bonded to or otherwise affixed to the inner circular surface of the toroidal body 100.

FIG. 5C is a cross sectional view along the section line 5A-5A' of the three conductor current transformer of FIG. 5, showing a second optional positioning member 130' affixed to the toroidal body 100, configured to position the first 102, second 104, and third 106 conductors in the conductor plane CP (FIG. 2), according to an embodiment of the disclosure. The optional positioning member may be a plate or cover of electrically insulating material, such as polystyrene or polypropylene plastic, with a low magnetic permeability, which is bonded to or otherwise affixed to the side surface of the toroidal body 100.

FIG. 6 illustrates a double-winding ground fault sensing circuit system, using the three conductor current transformer of FIG. 5. The first current processing circuitry 310 is connected to the first winding 110L and is configured to determine the first secondary current in the first winding 110L. The second current processing circuitry 320 is connected to the second winding 110R and is configured to determine the second secondary current in the second winding 110R. The processor 340 connected to the first 310 and second 3 neutral 20 processing circuitry, is configured to determine a ground fault in one of the first conductor 102 or the second conductor 104, based on the determined first secondary current and second secondary currents, according to an embodiment of the disclosure.

Example 3: Double-Winding, Three Conductor, No Ground Fault

In EXAMPLE 3 of the double-winding ground fault sensing circuit system of FIG. 6 on the load side of the circuit breaker, let the first conductor 102 and the second conductor 104 be respective load conductors L1 and L2 and let the third conductor 106 be a neutral conductor N in a single phase, three wire power system. If there is no ground fault condition in the L1 load conductor 102, no ground fault condition in the L2 load conductor 104, and there is no ground fault condition in the N neutral conductor 106, then the current in the N neutral conductor 106 will equal the sum of the currents in the L1 load conductor and in the L2 load conductor 104. The magnitude of the magnetic fluxes 102', 104' and 106' that couple the first winding 110L will equal the magnitude of the magnetic fluxes 102', 104' and 106' that couple the second winding 110R. Accordingly, the processor 340 determines that the first secondary current in the first winding 110L will equal the second secondary current in the second winding 110R. The secondary current in either of the windings 110L and 110R may be used to determine the load current in the L1 load conductor 102 or the load current in the L2 load conductor 104. FIG. 6A is an example table of representative data for Example 3, illustrating a double-winding, three conductor, no ground fault test with the processor 340 determining that the difference delta between the first secondary current in the first winding 110L substantially equals the second secondary current in the second winding 110R.

Example 4: Double-Winding, Three Conductor, Ground Fault in L1

In EXAMPLE 4 of the double-winding ground fault sensing circuit system of FIG. 6 on the load side of the circuit breaker, let the first conductor 102 and the second conductor 104 be respective load conductors L1 and L2 and let the third conductor 106 be a neutral conductor N in a single phase, three wire power system. Let there be a 5 mA ground fault condition in the L1 load conductor 102, no ground fault condition in the L2 load conductor 104, and there is no ground fault condition in the N neutral conductor 106. The total current due to the fault condition in the L1 load conductor 102 will be the L1 line current from the power source plus the 5 mA ground fault current. The current in the neutral N conductor 106 will equal the sum of the current in the L1 load conductor 102 minus the 5 mA ground fault current and the current in the L2 load conductor 104. The magnitude of the magnetic fluxes 102', 104' and 106' that couple the first winding 110L due to the current in the L1 load conductor 102 will be larger than the magnitude of the magnetic fluxes 102', 104' and 106' that couple the second winding 110R due to the current in the L2 load conductor 104. Accordingly, the processor 340 determines that the first secondary current in the first winding 110L will be larger than the second secondary current in the second winding 110R. The difference between first secondary current in the first winding 110L and the second secondary current in the second winding 110R, will be directly proportional to the fault current. Depending on which winding, either 110L or 110R, has the higher output, this will indicate whether the L1 load conductor 102 or the L2 load conductor 104 has the fault condition. FIG. 6B is an example table of representative data for Example 4, illustrating a double-winding, three conductor, and ground fault in conductor L1, with the processor 340 determining that the first secondary current in the first winding 110L is substantially greater than the second secondary current in the second winding 110R.

Example 5: Double-Winding, Three Conductor, Three Phase with Fault

In EXAMPLE 5 of the double-winding ground fault sensing circuit system of FIG. 6 on the load side of the circuit breaker, let the first conductor 102 be a first phase L1 conductor, the second conductor 104 be a second phase L2 conductor, and let the third conductor 106 be a third phase L3 conductor in a three phase, three wire power system. Let there be a 5 mA ground fault condition in the L1 load conductor 102, no ground fault condition in the L2 load conductor 104, and there is no ground fault condition in the L3 load conductor 106. The total current due to the fault condition in the L1 load conductor 102 will be the L1 line current from the power source plus the 5 mA ground fault current. The current in the L2 load conductor 104 and the L3 load conductor 106 will equal the current in the L1 load conductor 102 minus the 5 mA ground fault current. The magnitude of the magnetic fluxes 102', 104' and 106' that couple the first winding 110L due to the current in the proximately located L1 load conductor 102 will be larger than the magnitude of the magnetic fluxes 102', 104' and 106' that couple the second winding 110R due to the currents in the L2 load conductor 104 and in the L3 load conductor 106. Accordingly, the processor 340 determines that the first secondary current in the first winding 110L will be larger than the second secondary current in the second winding 110R. Due to the 5 mA ground fault condition in the first phase L1 conductor 102, the difference between first secondary current in the first winding 110L and the second secondary current in the second winding 110R, will be directly proportional to the fault current. Depending on which winding, either 110L or 110R, has the higher output, this will indicate which phase L1 conductor 102 or phase L3 conductor 106 has the fault condition.

FIG. 6C is an example table of representative data for Example 5, illustrating a double-winding, three phase, three conductor, and ground fault in conductor L1, with the processor 340 determining that the first secondary current in the first winding 110L is substantially greater than the second secondary current in the second winding 110R.

The benefits of the double-winding ground fault sensing circuit system of FIG. 6, include:
Determine if a ground fault is the left pole or the right pole;
Measure load current:
Run time adjustment to thresholds to account for load shift.
Report load current to end user.
Electronically track thermal overloads.
In component testing and screening of the three conductor, ground fault dual winding sensor of FIG. 4 during manufacture, an average may be determined by the processor 340 of the first secondary current in the first winding 110L and the second secondary current in the second winding 110R. The average value of the secondary currents is related or proportional to load current for the circuit comprising conductors 102 and 104. Determining the average of the two secondary currents minimizes errors that are inherent in the windings around the core of a current transformer.

As used in a miniature circuit breaker, the three conductor, ground fault dual winding sensor of FIG. 4 has the capability of performing the functions of two conventional current transformers, first by its ability to sense both load current on a single conductor, either 102 or 104, and ground faults between the two conductors 102 and 104. Secondly, a ground fault may be determined based on an absolute difference between the first and second secondary currents.

Moreover, the three conductor, ground fault dual winding sensor of FIG. 4 is able to distinguish which circuit conductor 102 or 104 has the ground fault. This is a function that is not provided by conventional current transformers. A ground fault in the first conductor 102 is determined when the first secondary current in the first winding 110L is greater than the second secondary current in the second winding 110R. And oppositely, a ground fault in the second conductor 104 is determined when the second secondary current in the second winding 110R is greater than the first secondary current in the first winding 110L.

In example embodiments, the first conductor 102 and the second conductor 104 are line conductors and the third conductor 106 is a neutral conductor in a single phase, three wire power system or a third phase in a three-phase, three wire power system.

In example alternate embodiments, the first conductor 102, the second conductor 104, and the third conductor 106 are line conductors in a three phase, three wire power system.

FIG. 7 is a front view of a three conductor current transformer with a third continuous winding 120 formed on the toroidal ferrite core 100 of FIG. 5. The figure includes the left side, first winding 110L on the left half 100L of the toroid wrapped around the opening of the toroid and coupling the lines of magnetic flux 102' in the left half 100L of the core produced by a first current in the first conductor 102. The right side, second winding 110R is on the right half 100R of the toroid wrapped around the opening of the toroid and couples the lines of magnetic flux 104' in the right half 100R of the core produced by second current in the second conductor 104. The third continuous winding 120 around the entire circumference of the toroid 100 is wrapped around the opening of the toroid and couples the lines of magnetic flux 106' around the entire circumference of the toroid 100 produced by an electrical current in the third conductor 106, according to an embodiment of the disclosure.

Figure 7A:
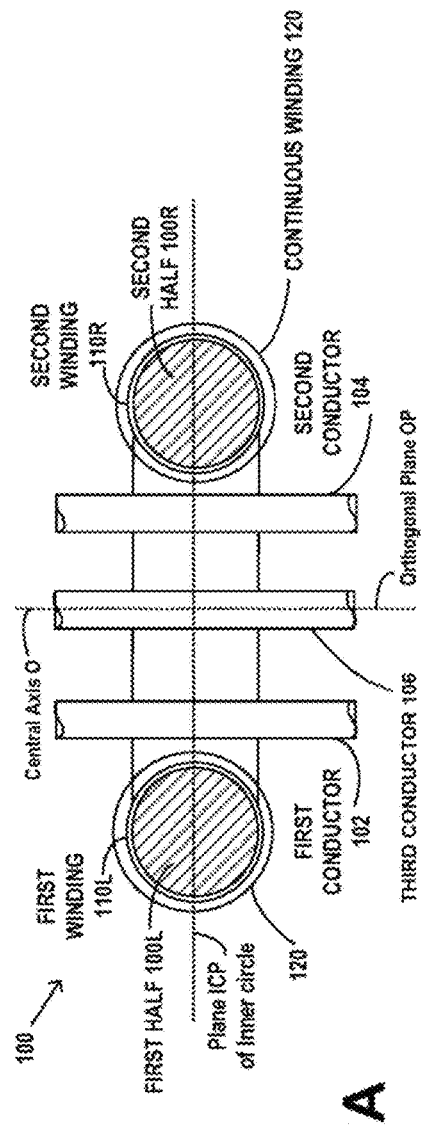
FIG. 7A is a cross sectional view along the section line 7A-7A' of the three conductor current transformer of FIG. 7, showing the first, second, and third windings and the first conductor, the second conductor, and the third conductor, according to an embodiment of the disclosure.

FIG. 7A is a cross sectional view along the section line 7A-7A' of the three conductor current transformer of FIG. 7, showing the first, second, and third continuous windings and the first conductor, the second conductor, and the third conductor, according to an embodiment of the disclosure.

FIG. 8 illustrates a triple-winding ground fault sensing circuit system for three conductors, using the three conductor current transformer of FIG. 7, with a first current processing circuitry 310 connected to the first winding 110L and configured to determine the first secondary current in the first winding 110L. The second current processing circuitry 320 is connected to the second winding 110R and is configured to determine the second secondary current in the second winding 110R. The first winding 110L is configured to output the first secondary current or signal and the second winding 110R that is not connected to the first winding 110L, is configured to output the second secondary current or signal that is independent of the first secondary current or signal. The third current processing circuitry 330 is connected to the third continuous winding 120 and is configured to determine the third secondary current in the third continuous winding 120. The third winding 120 is wrapped continuously around both halves of the toroidal body, through the opening, overlapped with the first winding 110L and the second winding 110R, but is not connected to the first winding 110L or the second winding 110R. The third winding 120 is configured to output a third secondary current or signal that is independent of the first and second secondary currents or signals. The third winding 120 is coupled through the current processing circuitry 330 to the same processor 340 or output circuit as are the first winding 110L and the second winding 110R. The processor 340 or output circuit is connected to the first 310, second 320, and third 330 processing circuitry. The processor 340 or output circuit is configured to determine information about at least one of the first current in the first conductor 102 or a second current in the second conductor 104 of the two parallel conductors, or a third current in the third conductor 106, based on a combination of the first secondary current or signal in the first winding 110L, the second secondary current or signal in the second winding 110R, and the third secondary current or signal in the third winding 120. The processor 340 or output circuit is configured to determine a ground fault in one of the first conductor 102 or the second conductor 104, based on the determined first secondary current and second secondary currents, according to an embodiment of the disclosure.

In an example embodiment, the third current processing circuitry 330 connected to the third winding, is configured to determine a third secondary current in the third winding 120 based on magnetic flux 106' in the third winding 120 magnetically coupled from the first current in the first conductor 102, the second current in the second conductor 104, and the third current in the third conductor 106.

In an example embodiment, the first conductor 102 and the second conductor 104 are line conductors and the third conductor 106 is a neutral conductor in a single phase, three wire power system or a third phase in a three-phase, three wire power system. The third secondary current in the third winding is directly proportional to a differential current that generates a magnetic field proportional to a ground fault.

In an example embodiment, the processor 340 determines a ground fault based on an absolute difference between the first secondary current in the first winding 110L and the second secondary current in the second winding 110R.

In an example embodiment, the processor 340 determines that there is a ground fault in the first conductor 102, when the first secondary current in the first winding 110L is greater than a sum of the second secondary current in the second winding 110R and a third secondary current in the third continuous winding 120.

In example embodiments, the first conductor 102 and the second conductor 104 are line conductors and the third conductor 106 is a neutral conductor in a single phase, three wire power system or a third phase in a three-phase, three wire power system.

In example alternate embodiments, the first conductor 102, the second conductor 104, and the third conductor 106 are line conductors in a three phase, three wire power system.

Example 6: Triple-Winding, Three Conductor, No Ground Fault

In a first example of the triple-winding ground fault sensing circuit system of FIG. 8 on the load side of the circuit breaker, let the first conductor 102 and the second conductor 104 be respective load conductors L1 and L2 and let the third conductor 106 be a neutral conductor N in a single phase, three wire power system. If there is no ground fault condition in the L1 load conductor 102, no ground fault condition in the L2 load conductor 104, and there is no ground fault condition in the N neutral conductor 106, then the current in the N neutral conductor 106 will equal the sum of the currents in the L1 load conductor and in the L2 load conductor 104. The magnitude of the magnetic fluxes 102', 104' and 106' that couple the first winding 110L will equal the magnitude of the magnetic fluxes 102', 104' and 106' that couple the second winding 110R. The magnitude of the magnetic fluxes 102', 104' and 106' that couple the continuous winding 120 mutually cancel each other out. Accordingly, the processor 340 determines that the continuous winding 120 has no secondary current (zero output) under a no fault condition. The first secondary current in the first winding 110L will equal the second secondary current in the second winding 110R. The secondary current in either of the windings 110L and 110R may be used by the processor 340 to determine the load current in either the L1 load conductor 102 or the load current in the L2 load conductor 104. In a modified version of this first example of FIG. 8, if there were an unbalanced load between L1 and L2, the secondary current in the winding 110L may be used to determine the load current in the L1 load conductor 102 and the secondary current in the winding 110R may be used to determine the load current in the load current in the L2 load conductor 104.

Example 7: Triple-Winding, Three Conductor, Ground Fault in L1

In EXAMPLE 7 of the triple-winding ground fault sensing circuit system of FIG. 8 on the load side of the circuit breaker, let the first conductor 102 and the second conductor 104 be respective load conductors L1 and L2 and let the third conductor 106 be a neutral conductor N in a single phase, three wire power system. Let there be a 5 mA ground fault condition in the L1 load conductor 102, no ground fault condition in the L2 load conductor 104, and there is no ground fault condition in the N neutral conductor 106. The total current due to the fault condition in the L1 load conductor 102 will be the L1 line current from the power source plus the 5 mA ground fault current. The current in the neutral N conductor 106 will equal the sum of the current in the L1 load conductor 102 minus the 5 mA ground fault current and the current in the L2 load conductor 104. The magnitude of the magnetic fluxes 102', 104' and 106' that couple the first winding 110L and that couple the continuous winding 120 due to the current in the L1 load conductor 102, will be larger than the magnitude of the magnetic fluxes 102', 104' and 106' that couple the second winding 110R and that couple the continuous winding 120 due to the current in the L2 load conductor 104. Accordingly, the processor 340 determines that the continuous winding 120 will have an output proportional to the fault current. The first secondary current in the first winding 110L will be larger than the second secondary current in the second winding 110R. The difference between first secondary current in the first winding 110L and the second secondary current in the second winding 110R, will be directly proportional to the fault current. Depending on which winding, either 110L or 110R, has the higher output, this will indicate whether the L1 load conductor 102 or the L2 load conductor 104 has the fault condition. In a modified version of this second example of FIG. 8, if there were an unbalanced load between L1 and L2, the secondary current in the winding 110L may be used to determine the load current in the L1 load conductor 102 and the secondary current in the winding 110R may be used to determine the load current in the load current in the L2 load conductor 104. FIG. 8A is an example table of representative data for Example 7, illustrating a triple-winding, single-phase, three conductor, and ground fault in conductor L1, with the processor 340 determining that the first secondary current in the first winding 110L is substantially greater than the second secondary current in the second winding 110R. The processor 340 determines that the continuous winding 120 has an output proportional to the fault current.

The benefits of the triple-winding ground fault sensing circuit system of include:

Determine if a ground fault is the left pole or the right pole;

Addition of third winding to assist fault detection along with split winding delta calculation.

Measure load current:

Run time adjustment to thresholds to account for load shift.

Report load current to end user.

Electronically track thermal overloads.

The resulting apparatus and system provide a multifunction single core sensor for ground fault application, which reduce the effects in a miniature circuit breaker, of errors that are inherent in the windings around the core of a current transformer. Moreover, the multifunction single core sensor reduces the need for extra current transformers in a miniature circuit breaker, by performing dual functions of both measuring the load current as well as detecting a ground fault.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "component", "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. A ground fault sensor for a circuit, comprising:
    a current transformer having a body with an opening having a central axis running along a length of the opening, the current transformer having a first winding and a second winding wrapped around the body and through the opening, the first winding configured to output a first signal and the second winding configured to output a second signal, the body surrounding two parallel conductors that pass through the opening parallel with the central axis and occupy a conductor plane that is coincident with the central axis, the two parallel conductors being substantially equidistant from the central axis;
    wherein the first signal corresponds to a first secondary current in the first winding induced by a magnetic flux in the first winding that is magnetically coupled with a first current in a first conductor of the two parallel conductors;
    wherein the second signal corresponds to a second secondary current in the second winding induced by a magnetic flux in the second winding that is magnetically coupled with a second current in a second conductor of the two parallel conductors; and
    wherein the first winding is wrapped around a first half of the body and the second winding is wrapped around a second half of the body, and the first winding is non-overlapped with the second winding.

2. The ground fault sensor of claim 1, wherein information about a combination of the first signal in the first winding and the second signal in the second winding is determined by a combined signal circuit.

3. The ground fault sensor of claim 1, wherein the body surrounds a third conductor that passes through the opening of the body and is coincident with the central axis;
    wherein a third winding is wrapped continuously around both halves of the body, through the opening, overlapped with the first and second windings and configured to output a third signal; and
    wherein the first winding is configured to output the first signal on a first signal chain, the second winding is configured to output the second signal on a second signal chain, the third winding is configured to output the third signal on a third signal chain, and the first signal chain, second signal chain, and third signal chain are connected to a combined signal circuit.

4. The ground fault sensor of claim 1, wherein the first half of the body and the second half of the body are symmetrically opposed about an orthogonal plane that is substantially perpendicular to the conductor plane; and
    wherein the first conductor of the two parallel conductors is closer to the first winding than to the second winding, and the second conductor of the two parallel conductors is positioned closer to the second winding than to the first winding.

5. The ground fault sensor of claim 1, wherein the first winding is configured to output the first signal on a first signal chain, the second winding is configured to output the second signal on a second signal chain, the first signal chain and second signal chain are connected to a combined signal circuit, and wherein the combined signal circuit is an averaging circuit that determines an average of the first and second signals.

6. The ground fault sensor for a circuit of claim 1, wherein the first signal is output on a first signal chain, wherein the second signal is output on a second signal chain, and wherein the first signal chain and the second signal chain are independent with respect to one another.

7. A ground fault sensing circuit system, comprising:
- a current transformer having a body with an opening having a central axis running along a length of the opening, the current transformer having a first winding and a second winding wrapped around the body and through the opening, the first winding configured to output a first signal and the second winding configured to output a second signal, the body surrounding two parallel conductors that pass through the opening parallel with the central axis and occupy a conductor plane that is coincident with the central axis, the two parallel conductors being substantially equidistant from the central axis;
- wherein the first signal corresponds to a first secondary current in the first winding induced by a magnetic flux in the first winding that is magnetically coupled with a first current in a first conductor of the two parallel conductors;
- wherein the second signal corresponds to a second secondary current in the second winding induced by a magnetic flux in the second winding that is magnetically coupled with a second current in a second conductor of the two parallel conductors; and
- wherein the first winding is wrapped around a first half of the body and the second winding is wrapped around a second half of the body, and the first winding is non-overlapped with the second winding; and
- a processor coupled to the first winding to receive the first signal and coupled to the second winding to receive the second signal, the processor configured to determine information about at least one of a first current in a first conductor or a second current in a second conductor of the two parallel conductors, based on a combination of the first signal and the second signal.

8. The ground fault sensing circuit system of claim 7, wherein the body surrounds a third conductor that passes through the opening of the body and is coincident with the central axis;
- wherein a third winding is wrapped continuously around both halves of the body, through the opening, overlapped with the first and second windings and configured to output a third signal; and
- wherein the first winding is configured to output the first signal on a first signal chain, the second winding is configured to output the second signal on a second signal chain, the third winding is configured to output the third signal on a third signal chain, and the first signal chain, second signal chain, and third signal chain are connected to the processor.

9. The ground fault sensing circuit system of claim 7, wherein the first winding is configured to output the first signal on a first signal chain, the second winding is configured to output the second signal on a second signal chain, the first signal chain and second signal chain are connected to the processor, and wherein the processor determines an average of the first and second signals.

10. The ground fault sensing circuit system of claim 7, wherein the first signal is output on a first signal chain, wherein the second signal is output on a second signal chain, and wherein the first signal chain and the second signal chain are independent with respect to one another.

11. The ground fault sensing circuit system of claim 7, wherein a difference between the first signal in the first winding and the second signal in the second winding determined by the processor, indicates a ground fault in at least one of the two parallel conductors.

12. The ground fault sensing circuit system of claim 7, wherein a load current in at least one of a first conductor or a second conductor of the two parallel conductors is determined by the processor based on the first signal in the first winding and the second signal in the second winding.

13. The ground fault sensing circuit system of claim 7, wherein a ground fault is determined by the processor based on at least one of an absolute difference between the first signal in the first winding and the second signal in the second winding or when the first signal is greater than the second signal.

14. The ground fault sensing circuit system of claim 7, wherein the first half of the body and the second half of the body are symmetrically opposed about an orthogonal plane that is substantially perpendicular to the conductor plane; and
- wherein the first conductor of the two parallel conductors is closer to the first winding than to the second winding, and the second conductor of the two parallel conductors is positioned closer to the second winding than to the first winding.

15. A ground fault sensing circuit system, comprising:
- a current transformer having a body with an opening having a central axis running along a length of the opening, the current transformer having a first winding and a second winding wrapped around the body and through the opening, the first winding configured to output a first signal and the second winding configured to output a second signal the body surrounding two parallel conductors that pass through the opening parallel with the central axis and occupy a conductor plane that is coincident with the central axis, the two parallel conductors being substantially equidistant from the central axis;
- wherein the body surrounds a third conductor that passes through the opening of the body and is coincident with the central axis;
- wherein the first winding is wrapped around a first half of the body and the second winding is wrapped around a second half of the body, and the first winding is non-overlapped with the second winding;
- wherein a third winding is wrapped continuously around both halves of the body, through the opening, overlapped with the first and second windings, and configured to output a third signal; and
- a processor coupled to the first winding to receive the first signal, coupled to the second winding to receive the second signal, and coupled to the third winding to receive the third signal, the processor configured to determine information about at least one of a first current in a first conductor or a second current in a second conductor of the two parallel conductors, or a third current in the third conductor, based on a combination of the first signal in the first winding, the second signal in the second winding, and the third signal in the third winding.

16. The ground fault sensing circuit system of claim 15, wherein information about a combination of the first signal in the first winding, the second signal in the second winding, and the third signal in the third winding is determined by the processor.

17. The ground fault sensing circuit system of claim 15, wherein a load current of at least one of a first conductor or a second conductor of the two parallel conductors or the third conductor is determined by the processor based on the first signal in the first winding, the second signal in the second winding, and the third signal in the third winding.

18. The ground fault sensing circuit system of claim 15, wherein a ground fault in a first conductor of the two parallel conductors is determined by the processor when the first signal in the first winding is greater than a sum of the second signal in the second winding and the third signal in the third winding; and wherein a ground fault in at least one of a first conductor or a second conductor of the two parallel conductors or the third conductor is determined by the processor based on the third signal in the third winding.

19. The ground fault sensing circuit system of claim 15, wherein the first winding is configured to output the first signal on a first signal chain, the second winding is configured to output the second signal on a second signal chain, the first signal chain and second signal chain are connected to the processor, and wherein the processor determines an average of the first and second signals.

20. The ground fault sensing circuit system of claim 15, wherein the first signal is output on a first signal chain, wherein the second signal is output on a second signal chain, and wherein the first signal chain and the second signal chain are independent with respect to one another.

* * * * *